United States Patent [19]

Suzuki et al.

[11] 4,370,011
[45] Jan. 25, 1983

[54] CONTACT DRIVE ASSEMBLY FOR USE WITH ELECTRONIC PART TEST EQUIPMENT

[75] Inventors: Kenpei Suzuki; Shinichi Kōya; Hiroshi Satō, all of Gyoda, Japan

[73] Assignee: Takeda Riken Kogyo Kabushikikaisha, Tokyo, Japan

[21] Appl. No.: 202,589

[22] Filed: Oct. 31, 1980

[30] Foreign Application Priority Data

Nov. 12, 1979 [JP] Japan .............................. 54-146287

[51] Int. Cl.³ ........................................ H01R 13/629
[52] U.S. Cl. ............................. 339/74 R; 339/75 M; 339/117 P
[58] Field of Search ................ 339/74 R, 75 R, 75 M, 339/75 MP, 117 R, 117 P

[56] References Cited

U.S. PATENT DOCUMENTS

| 2,975,390 | 3/1961 | Cardascia et al. | 339/117 P |
| 2,978,666 | 4/1961 | McGregor | 339/117 P |
| 3,366,916 | 1/1968 | Oktay | 339/74 R |
| 3,848,221 | 11/1974 | Lee, Jr. | 339/176 MP |

OTHER PUBLICATIONS

IBM Technical Disclosure Bulletin, vol. 10, No. 8, Jan. 1968, pp. 1264–1265, "Thermal Test Socket".

*Primary Examiner*—John McQuade
*Attorney, Agent, or Firm*—Staas & Halsey

[57] ABSTRACT

In a contact drive assembly for use with test equipment for testing, for example, an IC element, a movable contact piece is brought into contact with a terminal pin of the IC element to connect it to a measuring circuit. A flexible tube is disposed adjacent the movable contact piece and compressed air is supplied to the flexible tube to inflate it, biasing the movable contact piece to engage with or disengage from the terminal pin.

9 Claims, 13 Drawing Figures

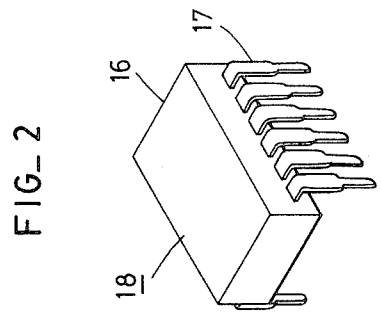
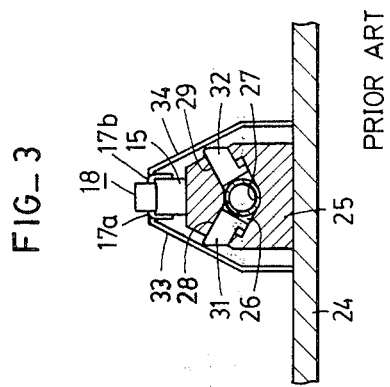
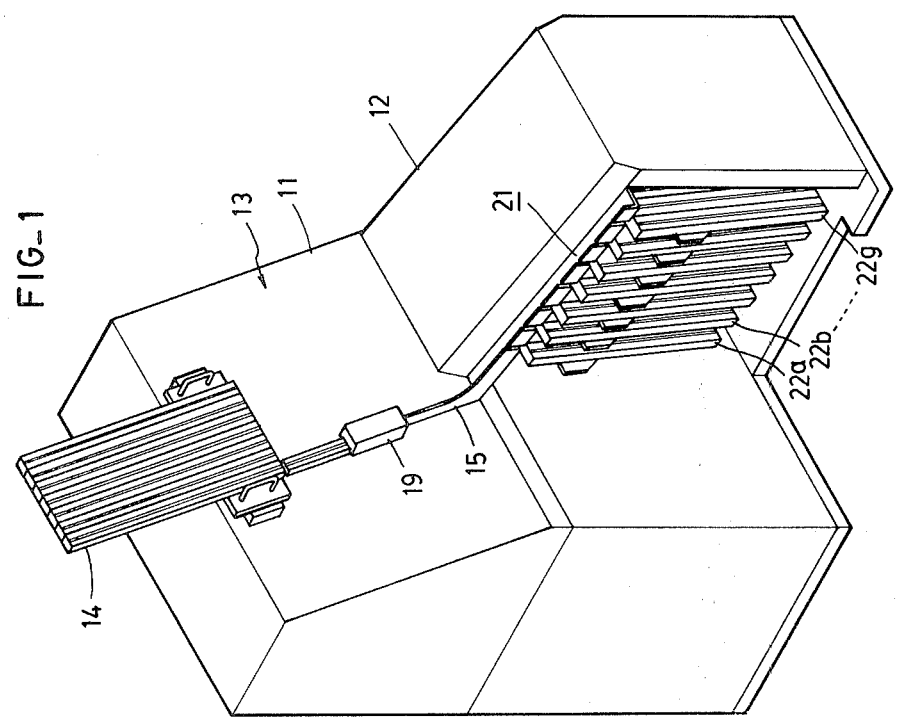

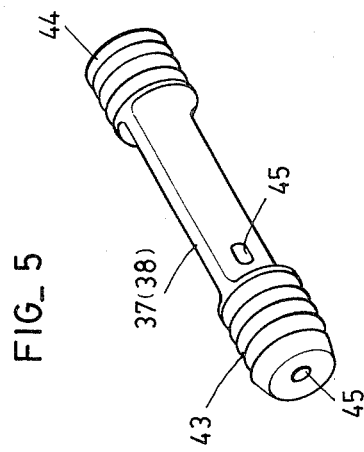
FIG_5
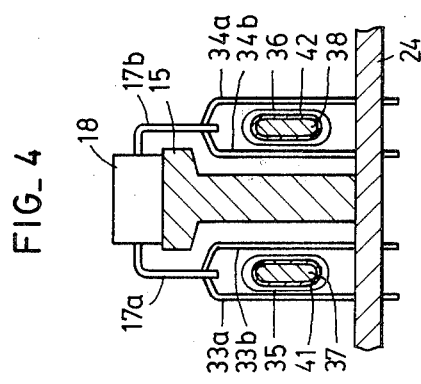
FIG_4
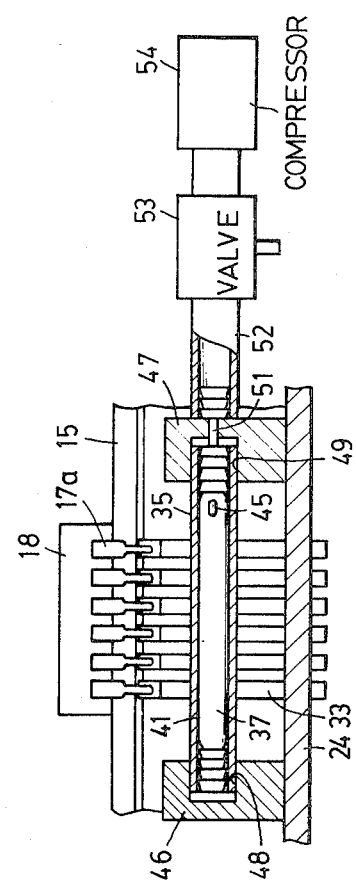
FIG_7
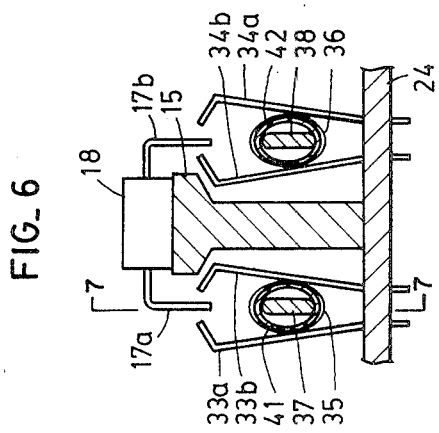
FIG_6

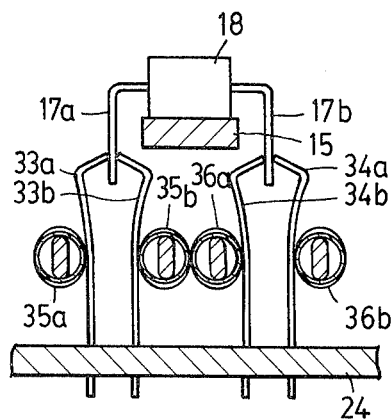
FIG_8
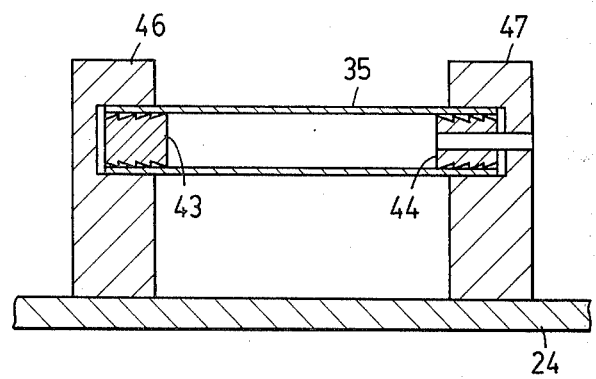
FIG_9
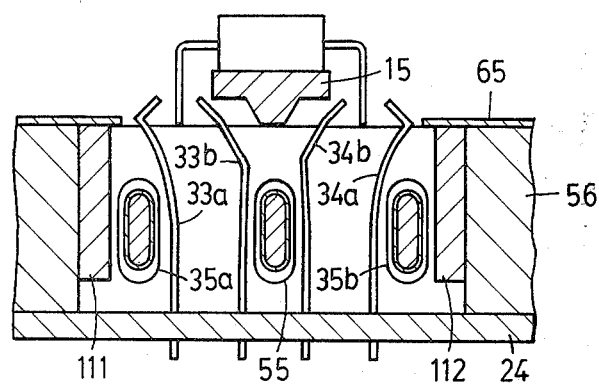
FIG_10

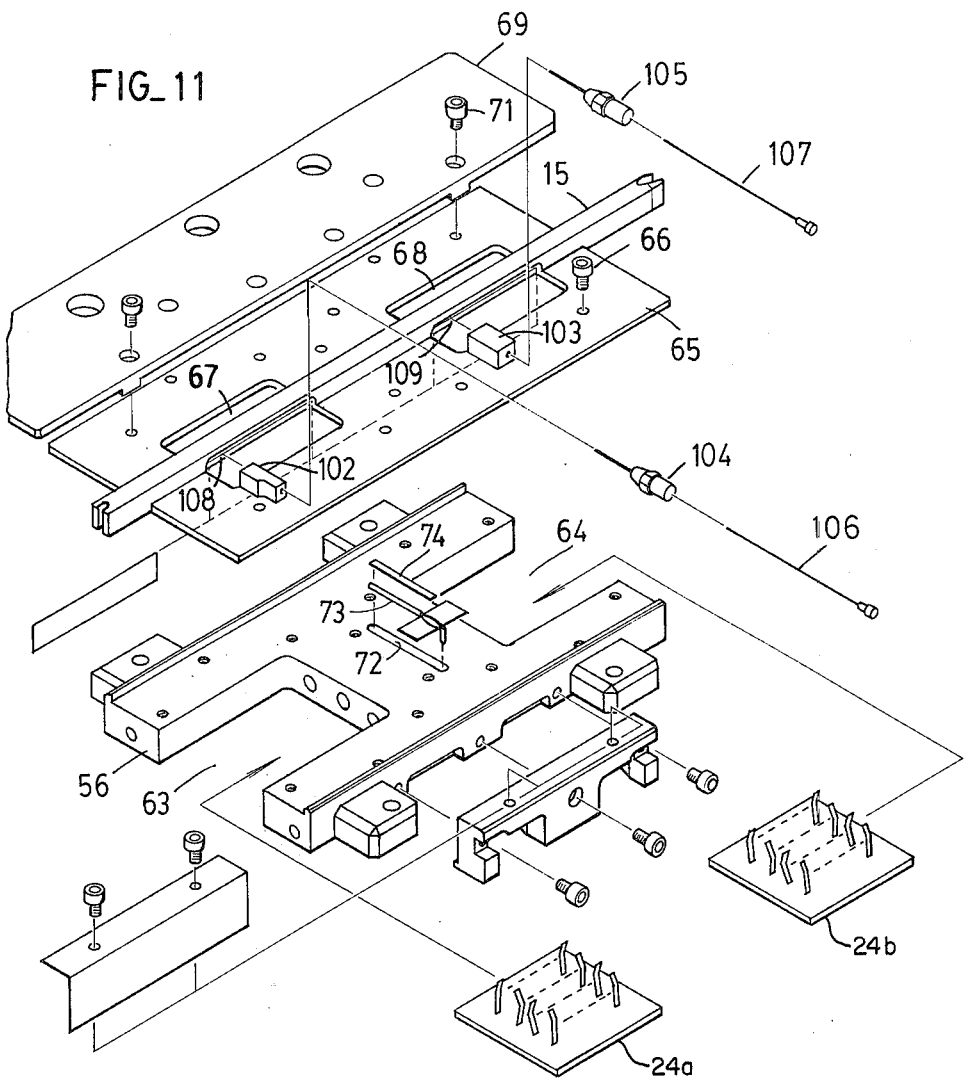
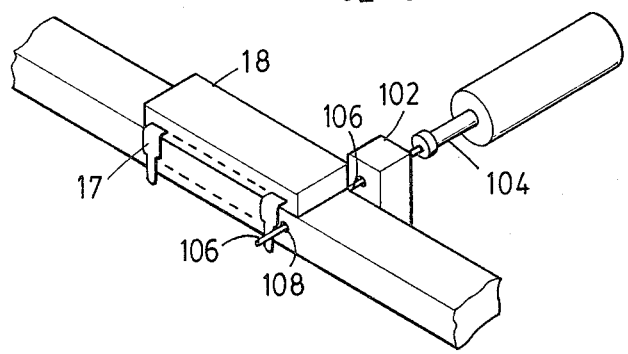

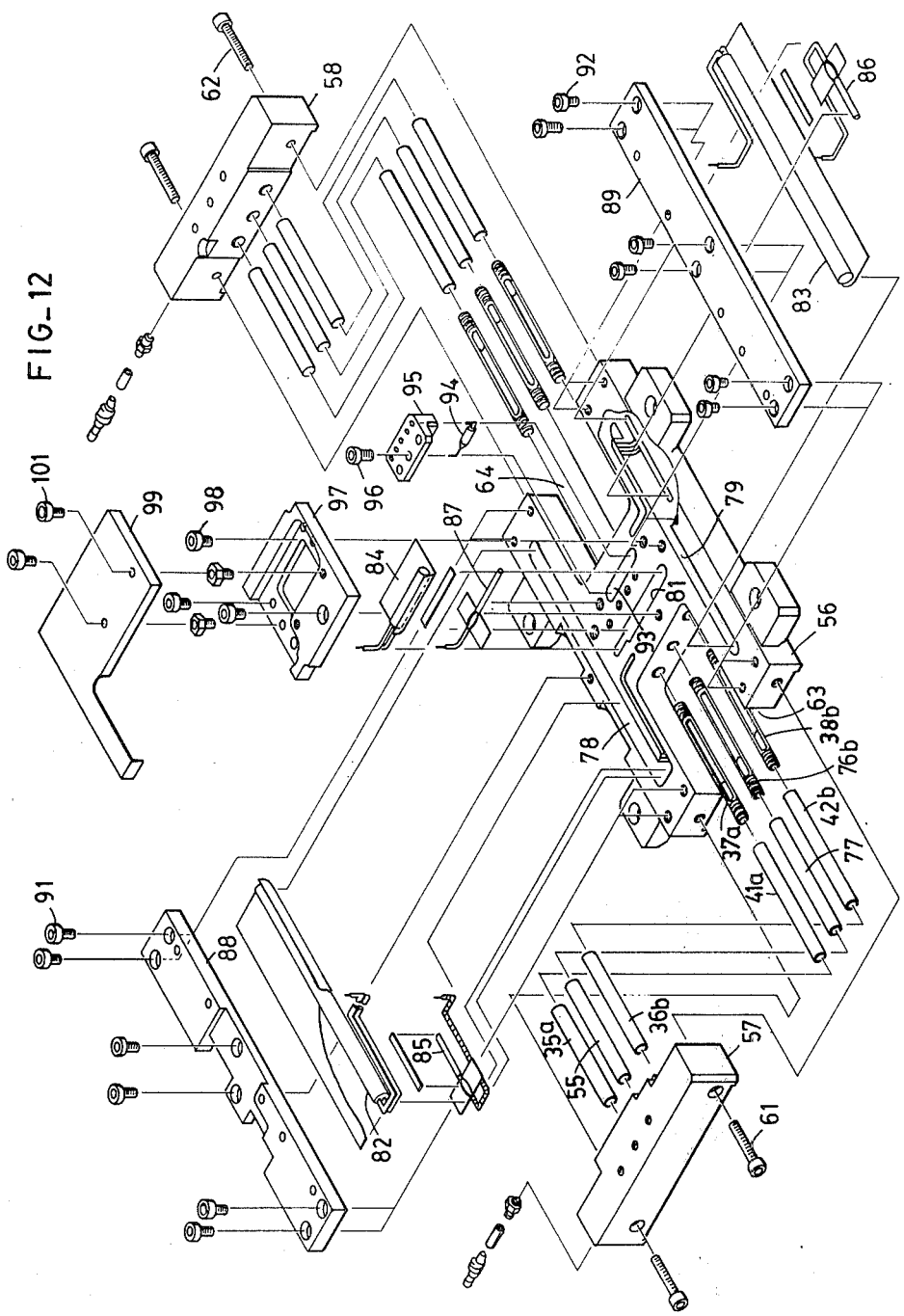

CONTACT DRIVE ASSEMBLY FOR USE WITH ELECTRONIC PART TEST EQUIPMENT

BACKGROUND OF THE INVENTION

The present invention relates to a contact drive assembly for use with test equipment for various measurements and tests of semiconductor integrated circuits, that is, electronic parts having at least one terminal pin, such as IC's, LSI's, resistance elements, capacitance elements and so forth. In particular, the present invention pertains to a contact drive assembly which automatically connects the terminal pin of such an electronic part under test with a test equipment measuring circuit.

With a conventional contact drive assembly of this kind, when an electronic part to be measured is placed in a measuring part of measuring equipment, a driver is rotated, by which a movable contact piece connected to the measuring circuit is moved, against the resiliency of the contact piece itself, into contact with a terminal pin of the electronic part. Such a prior art device includes mechanical moving parts and hence is defective in that when it is used for a long time, the mechanical moving parts become worn and loose, so that good contact between the movable contact piece and the terminal cannot be obtained, thereby making it impossible to conduct correct measurements or tests.

To avoid the above defect, there has been employed a method in which compressed air is supplied to a flexible tube to inflate it to press a movable member through the flexible tube and a movable contact piece is urged by the movable member to engage with or disengage from the terminal pin. This method employs less mechanical moving parts and ensures good contact between the movable contact piece and the terminal pin. Also in this case, however, the mechanical moving part of the movable member is involved and it is difficult for the movable contact piece to make good contact with the top end portion of the terminal pin without bending the terminal pin because of the contact piece urging force.

SUMMARY OF THE INVENTION

Accordingly, it is an object of the present invention to provide a contact drive assembly which has no mechanical moving parts and permits good contact between the movable contact piece and the terminal pin even when used for a long time, and hence has a long service life.

Another object of the present invention is to provide a contact drive assembly which is free from the possibility of bending the terminal pin and which ensures that the movable contact piece is pressed against the terminal pin under sufficient pressure to obtain good contact therebetween.

Another object of the present invention is to provide a contact drive assembly which is capable of simultaneously bringing individual movable contact pieces into good contact with a relatively large number of terminal pins.

Yet another object of the present invention is to provide a contact drive assembly which can be used under relatively high temperature conditions and which is capable of maintaining a good seal for compressed air.

According to the present invention, when an electronic part to be measured is held at a measuring position, a terminal pin of the electronic part and one end portion of a movable contact piece are adjacent each other. The other end of the movable contact piece is fixed to a stationary part and a flexible tube is held by the stationary part in close proximity to the movable contact piece. Compressed air is blown into the flexible tube to inflate it and is discharged therefrom to deflate it. When the compressed air is blown into the flexible tube, an air pressure is applied via the inflated flexible tube to the movable contact piece to resiliently contact it with the terminal pin. When the compressed air is discharged from the flexible tube, the movable contact piece retracts from the terminal pin due to the resiliency of the contact piece itself. Alternatively, when the compressed air is supplied to the flexible tube, the movable contact piece biased in contact with the terminal pin disengages therefrom and when the compressed air is discharged from the flexible tube, the movable contact piece retracts to contact the terminal pin due to the resiliency of the contact piece. Thus, it is possible to obtain a contact drive assembly which includes no mechanical moving parts and hence has a long service life.

In the case where the electronic part under test has a plurality of terminal pins, a common flexible tube can be provided, which extends in the direction of arrangement of a plurality of movable contact pieces to be individually contacted with the terminal pins. In this case, in order that when the compressed air is blown into the flexible tube, a uniform pressure may be applied to each movable contact piece, means for preventing the bending of the flexible tube can be provided on the stationary part adjacent the flexible tube on the opposite side from the movable contact pieces. Similarly, by incorporating a plate-like core member, having a flat portion substantially parallel with the direction of extension of the movable contact pieces, in the flexible tube, it is possible to prevent the flexible tube from bending in the direction of extension of the movable contact pieces when the flexible tube is inflated by the supply of compressed air. By disposing movable contact pieces on both sides of the terminal pin to resiliently hold its top end portion between the movable contact pieces, it is possible to urge the movable contact piece against the terminal pin with a sufficient contact pressure and to prevent bending of the top end portion of the terminal pin. By providing an elastic sealing tube concentrically within the flexible tube, the compressed air can be sealed in the flexible tube relatively easily. This sealing is of particular utility when employed under relatively high temperature conditions as in IC tests.

BRIEF DESCRIPTION OF THE DRAWINGS

FIG. 1 is a perspective view of the external appearance of one example of electronic part test equipment;

FIG. 2 is a perspective view of an IC element which is one kind of electronic part;

FIG. 3 is a sectional view showing an example of a conventional contact drive assembly;

FIG. 4 is a sectional view illustrating an embodiment of the contact drive assembly of the present invention;

FIG. 5 is a perspective view showing an example of a core member 37;

FIG. 6 is a sectional view of the contact drive assembly of the present invention, showing the state in which movable contact pieces are disengaged from terminal pins in the embodiment of FIG. 4;

FIG. 7 is a sectional view taken along line 7—7 in FIG. 6;

FIG. 8 is a sectional view of another embodiment of the contact drive assembly of the present invention, corresponding to FIG. 4;

FIG. 9 is a sectional view illustrating another embodiment of the contact drive assembly of the present invention, corresponding to FIG. 7;

FIG. 10 is a sectional view illustrating another embodiment of the contact drive assembly of the present invention, corresponding to FIG. 4;

FIG. 11 is an exploded perspective view of the upper part of the device shown in FIG. 10;

FIG. 12 is an exploded perspective view of the lower part of the device shown in FIG. 10; and FIG. 13 is a perspective view showing an example of stopper means for stopping an IC element at a measuring position.

DESCRIPTION OF THE PREFERRED EMBODIMENTS

The contact drive assembly of the present invention is used with test equipment for, for example, semiconductor integrated circuit elements. The test equipment of this kind is such, for example, as shown in FIG. 1, which has a main casing 11 having housed therein a measuring instrument and an auxiliary casing 12 projecting forwardly from the lower half portion of the main casing 11. The upper half portion of the front of the main casing 11 slopes down to the auxiliary casing 12, as indicated by the sloped portion 13. On the slope 13 is mounted a top magazine rack 14, in which a number of IC elements to be tested are housed. A rail 15 is mounted on the slope 13 to extend down from the lower end of one side of the top magazine rack 14. An IC element 18, which has a plurality of terminal pins 17 projecting out from either side of its body 16, as shown in FIG. 2, slides down the rail 15 from the top magazine rack 14. At the middle of the rail 15 there is provided a measuring part 19, in which a contact drive assembly is disposed, by which terminal pins of an IC element stopped in the measuring part 19 are connected to the measuring instrument placed in the main casing 11 for conducting various measurements and tests. After being measured, the IC element slides down the rail 15 from the measuring part 19 to a sorting part 21 in the auxiliary casing 12 and is sorted according to the test result and sent to any one of a plurality of bottom magazine racks 22a to 22g mounted on one side of the auxiliary casing 12.

Next, a description will be given, with reference to FIG. 3, of a conventional contact drive assembly of the type utilizing compressed air control techniques. Mounted on a fixed plate 24 is a metal block 25, on which the rail 15 is disposed. The metal block 25 has bored therein a hole 26 which extends substantially in parallel with the rail 15 and in which a flexible tube 27 is installed. Further, the metal block 25 has windows 28 and 29 formed on both sides thereof to communicate with the hole 26, and movable members 31 and 32 are respectively disposed in the windows 28 and 29 in a retractable manner. When the flexible tube 27 is inflated by blowing thereinto compressed air, the movable members 31 and 32 are pushed out by the inflated flexible tube 27 from the windows 28 and 29. On both sides of the metal block 25 movable contact pieces 33 and 34 are fixed at one end to the fixed plate 24 and the other ends of the movable contact pieces 33 and 34 press against terminal pins 17a and 17b of the IC element 18 on the rail 15. As the movable members 31 and 32 are pushed out from the windows 28 and 29, the movable contact pieces 33 and 34 are pressed outwardly to be disengaged from the terminal pins 17a and 17b of the IC element 18. Then, the IC element 18 is sent out from the measuring part and when the next IC element 18 arrives at the measuring part, the compressed air supplied to the flexible tube 27 is discharged to deflate it. As a consequence, the movable contact pieces 33 and 34, by their resiliency, push the movable members 31 and 32 back into the metal block 25 and contact the terminal pins 17a and 17b of the IC element 18.

With the above prior art contact drive assembly, the number of moving members used is small, but sometimes, after long use, the movable pieces 31 and 32 will not be driven back and forth smoothly, thereby resulting in bad contact between the movable contact pieces 33 and 34 and the terminal pins 17a and 17b. Further, the movable contact pieces 33 and 34 are respectively urged against the terminal pins 17a and 17b from one side. Since the top end portions of the terminal pins 17a and 17b are to be soldered afterwards, stains might have been removed only from the top end portions of the terminal pins for soldering. Accordingly, it is necessary to bring the movable contact pieces 33 and 34 into contact with the top end portions of the terminal pins 17a and 17b, but if too large a pressure is applied to the top end portion, then the terminal pin is bent. This imposes a limitation on the spring force of the movable contact piece; hence, the contact pressure cannot be increased.

FIG. 4 illustrates an embodiment of the contact drive assembly of the present invention. In FIG. 4 parts corresponding to those in FIG. 3 are identified by the same reference numerals. In the illustrated embodiment pairs of movable contact pieces 33a, 33b and 34a, 34b are disposed so that their free ends lie on both sides of each of the terminal pins 17a and 17b; namely, the terminal pins are each resiliently held between one of the pairs of movable contact pieces, which are fixed at the other ends to the fixed plate 24.

In the present invention, flexible tubes 35 and 36 are respectively provided between the movable contact pieces 33a and 33b and between 34a and 34b in close proximity thereto so that when inflated by a supply of compressed air, the flexible tubes 35 and 36 push the movable contact pieces 33a, 33b and 34a, 34b outwardly. As the flexible tubes 35 and 36, use is made of such tubes which are flexible enough to be deformable by the spring forces of the movable contact pieces 33a, 33b and 34a, 34b when not supplied with the compressed air but to be inflatable to a predetermined diameter when supplied with compressed air. In this embodiment, the flexible tubes 35 and 36 are each shown to have a dual structure so as to ensure excellent sealing of the flexible tubes when compressed air is supplied to them. To this end, core members 37 and 38 elliptical in section are respectively covered with sealing tubes 41 and 42 made of, for example, silicone rubber, which are, in turn, covered with the flexible tubes 35 and 36, respectively. The core member 37 (38) is elliptical in section at the portion confronting each terminal pin of the IC element 18 and columnar at both end portions 43 and 44 (FIG. 5). The sealing tube 41 (42) airtightly seals the columnar end portions 43 and 44. The one columnar end portion 43 has formed therein a hole 45 extending along its axis to open to that flat portion of the core member 37 having the elliptical section. The peripheral surfaces of the columnar end portions 43 and 44 are corrugated to promote the sealing action of the sealing tube 41. When not supplied with the compressed air, the sealing tube 41 sticks fast to the peripheral surface of the core member 37; namely, the sealing tubes 41 and 42 elastically expand and contract. The sealing tubes 41 and 42 are respectively covered with the flexible tubes 35 and 36. The flexible tubes 35 and 36 can be made of a film-like material which does not expand much. When inflated by the compressed air, the sealing tubes 41 and 42 are controlled by the flexible tubes 35 and 36 so that their diameters may not exceed a predetermined value, thus limiting the movement of the movable contact pieces 33a, 33b and 34a, 34b as shown in FIG. 6.

The core member 37, having mounted thereon the sealing tube 41 and the flexible tube 35, is pressed at both ends into round holes 48 and 49 respectively made in blocks 46 and 47 on the fixed plate 24, as illustrated in FIG. 7. The inner diameters of the round holes 48 and 49 are slightly reduced towards their inner ends to ensure the sealing between the core member 37 and the blocks 46 and 47. The one block 47 has a hole 51 which communicates with the hole 45 formed in the columnar end portion 43 of the core member 37, and the hole 51 is linked with one of the ports of a three-way value 53 via a pipe 52. Another port of the three-way value 53 is coupled with a compressor 54 used as a compressed air source and another port is opened to the outside air. By controlling the three-way value 53, the compressed air is supplied to the tube 41 and discharged therefrom. In this way, the flexible tube 35 is supported by the blocks 46 and 47 between the movable contact pieces 33a and 33b, and similarly the flexible tube 36 is supported by the blocks 46 and 47 between the movable contact pieces 34a and 34b, and further the flexible tube 36 communicates with the hole 51 via a hole made in the block 47, though not shown.

With such an arrangement, the movable contact pieces 33a, 33b and 34a, 34b can be controlled by the inflation and deflation of the flexible tubes 35 and 36 to get into and out of contact with the terminal pins 17a and 17b, as shown in FIGS. 4 and 6. This contact drive assembly has no moving mechanism and can be produced in small sizes and at low cost. Especially, since the movable contact pieces 33a, 33b and 34a, 34b can be moved in such directions as to hold therebetween the terminal pins 17a and 17b of the IC element 18, even if the contact pressures of the movable contact pieces with the terminal pins are large, there is no possibility of the terminal pins being bent; consequently, this provides for enhanced reliability in the contact therebetween.

The above-described embodiment is arranged so that the movable contact pieces 33a, 33b and 34a, 34b are always biased in the directions to hold therebetween the terminal pins 17a and 17b and make contact with them when no compressed air is supplied to the flexible tubes 35 and 36. It is also possible, however, to adopt such an arrangement as shown in FIG. 8 in which the movable contact pieces 33a, 33b and 34a, 34b are always biased in such directions as to move away from each other and make contact with the terminal pins 17a and 17b when flexible tubes 35a, 35b and 36a, 36b are inflated. As depicted in FIG. 8, the flexible tubes 35a and 35b are disposed on the outside of the movable contact pieces 33a and 33b, whereas the flexible tubes 36a and 36b are disposed on the outside of the movable contact pieces 34a and 34b.

Although in the above the core members 37 and 38 are respectively inserted in the flexible tubes 35 and 36 over their entire lengths, it is also possible to insert only the sealing core members 43 and 44 in both end portions of the flexible tube 35, leaving free the portion for driving the movable contact pieces 33a and 33b, as shown in FIG. 9. The intermediate portions of the core members 37 and 38 need not always be flat but may also be of a rod-like configuration thinner than the columnar end portions.

In the embodiment of FIG. 8, the flexible tubes 35b and 36a disposed between the movable contact pieces 33b and 34b may also be replaced with one flexible tube 55, as illustrated in FIG. 10. A specific example of the arrangement of FIG. 10 is shown in exploded form in FIGS. 11 and 12. This example is designed to measure two IC elements simultaneously. In FIGS. 11 and 12, blocks 57 and 58 are attached by means of screws 61 and 62 to both ends of an H-shaped block 56 made of e.g., aluminum, to define two openings 63 and 64. A rail plate 65 is secured by screws 66 to the upper surfaces of blocks 56 to 58 to cover the openings 63 and 64. The rail plate 65 has formed therein openings 67 and 68 in opposing relation to the openings 63 and 64, respectively, and the rail 15 is mounted on the rail plate 65 to extend across the openings 67 and 68 centrally thereof. The rail plate 65 is covered with a heat-proof cover 69 made of e.g., glass epoxy resin, fixed thereto by screws 71. The illustrated example is designed for heat test of IC elements, so that a temperature sensor 73 is disposed in a groove 72 formed in the central portion of the block 56, the groove 72 being covered with a lid 74. As shown in FIGS. 10 and 11, the movable contact pieces 33a, 33b and 34a, 34b mounted on a fixed plate 24a are disposed in the opening 63, with their end portions lying on both sides of the rail 15 extending across the opening 67. Also in the opening 64 are disposed the movable pieces 33a, 33b and 34a, 34b mounted on a fixed plate 24b. The fixed plates 24a and 24b are secured to the H-shaped block 56 to close the openings 63 and 64, respectively. In each of the openings 63 and 64 the flexible tubes 35a and 36b are placed on the outside of the movable contact pieces 33a and 34a and the flexible tube 55 is disposed between the movable contact pieces 33b and 34b, as shown in FIG. 12. The flexible tubes respectively have inserted therein core members 37a, 38a and 76 and sealing tubes 41a, 42b and 77. The inside walls of the block 56 lie near the flexible tubes 35a and 36b on the opposite sides from the movable contact pieces 33a and 34a to prevent bending of the flexible tubes 35a and 36b, as indicated by 111 and 112 in FIG. 10. In grooves 78, 79 and 81 formed in the bottom of the block 56 are respectively mounted heaters 82, 83 and 84 and temperature sensors 85, 86 and 87. The grooves 78 and 79 are respectively closed with covers 88 and 89 fixed by screws 91 and 92 to the block 56. A temperature fuse 94 is disposed in a groove 93 made in the block 56 and a terminal plate 95 is fixedly secured by screws 96 to the block 56 to cover the groove 93. The groove 81 is closed by a cover 97 fixed by screws 98 to the block 56 and a cover 99 is fixed by screws 101 to the cover 97.

As shown in FIGS. 11 and 13, there is provided stopper means by which the IC element 18 sliding down the rail 15 is stopped at a predetermined position. That is, stopper supports 102 and 103 are provided on the rail plate 65 near the openings 67 and 68, and sleeves 104 and 105 are inserted into small through holes made in the stopper supports 102 and 103. Stopper pins 106 and 107 are detachably passed through the sleeves 104 and 105, respectively, so that their projecting ends may freely be inserted into small holes 108 and 109 made in the rail 15. The IC element 18 sliding down the rail 15 is stopped, with the narrowed portion of its foremost terminal pin butted against the stopper pin 106 (107). Since the pitch of the narrowed portion of the terminal pin 17 of the IC element 18 is common to various other IC elements, the movable contact pieces can be contacted with terminal pins of any other IC elements.

In the case where such a core member as shown in FIG. 5 is incorporated in the flexible tube, it is possible to prevent the flexible tube from being curved in the lengthwise direction of each movable contact piece by disposing the core member so that its flat surface is parallel with the movable contact piece confronting it. For sealing the flexible tube, use may also be made, for example, of an O-ring in place of the aforesaid sealing tube; but from the viewpoint of maintaining the flexible tube heat-proof, the sealing tube is preferred. The core member facilitates the sealing and the mounting of the flexible tube. In an experiment in which a polyimide film tube 50 μm thick and 5.6 mm in diameter was used as the flexible tube, a silicone rubber tube 3 mm in inner diameter and 4 mm in inner diameter and 4 mm in outer diameter was used as the sealing tube. A core member having columnar end portions 5 mm in diameter was used, and compressed air under a pressure of 4 Kg/cm$^2$ was supplied to the flexible tube. It was determined that the movable contact piece can be satisfactorily brought into contact with a terminal pin spaced 1 to 2 mm apart therefrom. It is needless to say that the present invention is also applicable to the connection of other electronic parts as well as IC elements.

It will be apparent that many modifications and variations may be effected without departing from the scope of the novel concepts of this invention.

What is claimed is:

1. A contact drive assembly for use with electronic part test equipment for testing an electronic part having at least one terminal pin, comprising:
   holding means for holding the electronic part under test at a test position;
   a stationary part;
   at least one movable contact piece formed of a resilient conductive material and disposed with a top end thereof positioned opposite the terminal pin of the electronic part and fixed at the other end to the stationary part;
   a flexible tube supported by the stationary part in close proximity to said at least one movable contact piece;
   an elastic sealing tube within said flexible tube;
   a compressed air source; and
   compressed air control means, operatively connected between said elastic sealing tube and said compressed air source, for supplying compressed air from said compressed air source into said elastic sealing tube or discharging the compressed air from said elastic sealing tube, the compressed air being supplied into the sealing tube to perform sealing for the compressed air, so that when the compressed air is supplied into said elastic sealing tube, said flexible tube presses against said at least one movable contact piece to resiliently bias said at least one movable contact piece to engage with or disengage from the terminal pin, the amount of biasing of said at least one movable contact piece during the supply of the compressed air being determined by the inflation of said flexible tube.

2. A contact drive assembly according to claim 1, wherein said flexible tube and said elastic sealing tube are made of a heat-proof synthetic resin.

3. A contact drive assembly for use with electronic part test equipment for testing an electronic part having at least one terminal pin, comprising:
   holding means for holding the electronic part under test at a test position;
   a stationary part;
   at least one movable contact piece formed of a resilient conductive material and disposed with a top end thereof positioned opposite the terminal pin of the electronic part and fixed at the other end to the stationary part;
   a flexible tube supported by the stationary part in close proximity to said at least one movable contact piece;
   a core member positioned within said flexible tube and having end portions sealed to said flexible tube;
   a compressed air source; and
   compressed air control means, operatively connected between said flexible tube and said compressed air source, for supplying compressed air from the compressed air source into said flexible tube or discharging the compressed air from said flexible tube, so that when the compressed air is supplied into said flexible tube, said flexible tube presses against said at least one movable contact piece to resiliently bias said at least one movable contact piece to engage with or disengage from the terminal pin.

4. A contact drive assembly according to claim 3, wherein said core member has an intermediate portion which is flat, and wherein the flat portion extends substantially parallel to the direction of extension of said at least one movable contact piece.

5. A contact drive assembly according to claim 1 or 3, wherein the electronic part has a plurality of aligned terminal pins projecting therefrom, wherein at least one movable contact piece is disposed opposite each of the plurality of aligned terminal pins, wherein the movable contact pieces are aligned, and wherein said flexible tube is provided in common to the movable contact pieces to extend in the direction of their alignment.

6. A contact drive assembly according to claim 5, further comprising means for preventing the flexible tube from being curved when the compressed air is supplied thereinto, said preventing means being provided on the stationary part in close proximity to said flexible tube on the opposite side from the movable contact pieces.

7. A contact drive assembly according to claim 1 or 3, wherein said at least one movable contact piece comprises two movable contact pieces provided on opposite sides of the terminal pin of the electronic part under test to normally hold the terminal pin resiliently between said two movable contact pieces, and wherein said flexible tube is disposed between said two movable contact pieces so that when the compressed air is supplied into said flexible tube, said two movable contact pieces are pushed outwardly to disengage their top ends from the terminal pin.

8. A contact drive assembly according to claim 1 or 3, further comprising an auxiliary flexible tube, wherein said at least one movable contact piece comprises two movable contact pieces provided on opposite sides of the terminal pin in a manner to be normally held out of contact with the terminal pin, and wherein said flexible tube and said auxiliary flexible tube are each disposed on the outside of one of said two movable contact pieces, so that when the compressed air is supplied into the flexible tubes, said two movable contact pieces are moved to hold therebetween the terminal pin.

9. A contact drive assembly according to claim 8, wherein first and second terminal pins project from either side of the electronic part, wherein two movable contact pieces, comprising first and second inner movable contact pieces and first and second outer movable contact pieces, are disposed on opposite sides of each of said first and second terminal pins, and wherein said auxiliary flexible tube is disposed between the first and second inner movable contact pieces in common thereto, further comprising an outer flexible tube, wherein said flexible tube and said outer flexible tube are disposed on the outside of each of the first and second outer movable contact pieces.

* * * * *

UNITED STATES PATENT AND TRADEMARK OFFICE
CERTIFICATE OF CORRECTION

PATENT NO. : 4,370,011

DATED : JANUARY 25, 1983

INVENTOR(S) : KENPEI SUZUKI ET AL.

It is certified that error appears in the above-identified patent and that said Letters Patent is hereby corrected as shown below:

```
Col. 5, line 26, "value" should be --valve--;
        line 27, "value" should be --valve--;
        line 30, "value" should be --valve--.
Col. 6, line 19, before "e.g.," insert --,--;
        line 27, after "of" insert --,--.
```

Signed and Sealed this

Twenty-sixth Day of July 1983.

[SEAL]

Attest:

GERALD J. MOSSINGHOFF

*Attesting Officer*    *Commissioner of Patents and Trademarks*